(12) United States Patent
Zhang

(10) Patent No.: US 10,879,102 B2
(45) Date of Patent: Dec. 29, 2020

(54) FLUX-FREE SOLDER BALL MOUNT ARRANGEMENT

(71) Applicant: Jian Zhang, Brookline, MA (US)

(72) Inventor: Jian Zhang, Brookline, MA (US)

(73) Assignee: Boston Process Technologies, Inc, Peabody, MA (US)

( * ) Notice: Subject to any disclaimer, the term of this patent is extended or adjusted under 35 U.S.C. 154(b) by 43 days.

(21) Appl. No.: 15/998,298

(22) Filed: Aug. 1, 2018

(65) Prior Publication Data
US 2019/0043745 A1 Feb. 7, 2019

(51) Int. Cl.
| | |
|---|---|
| H01L 21/48 | (2006.01) |
| H01L 21/68 | (2006.01) |
| G06T 7/00 | (2017.01) |
| H01L 21/687 | (2006.01) |
| H01L 21/683 | (2006.01) |
| H01L 21/67 | (2006.01) |
| H01L 23/00 | (2006.01) |
| G06T 7/33 | (2017.01) |

(52) U.S. Cl.
CPC ............ *H01L 21/681* (2013.01); *G06T 7/001* (2013.01); *G06T 7/33* (2017.01); *H01L 21/67253* (2013.01); *H01L 21/67259* (2013.01); *H01L 21/67288* (2013.01); *H01L 21/682* (2013.01); *H01L 21/6838* (2013.01); *H01L 21/68707* (2013.01); *H01L 24/11* (2013.01); *H01L 24/17* (2013.01); *G06T 2207/30148* (2013.01); *H01L 2224/11005* (2013.01); *H01L 2224/11013* (2013.01); *H01L 2224/11334* (2013.01)

(58) Field of Classification Search
CPC .................................................. H01L 21/4853
See application file for complete search history.

(56) References Cited

U.S. PATENT DOCUMENTS

| | | | | |
|---|---|---|---|---|
| 5,431,332 A | * | 7/1995 | Kirby ...................... | B23K 1/20 118/213 |
| 2006/0043154 A1 | * | 3/2006 | Kirby ................... | B23K 1/0016 228/37 |
| 2010/0272884 A1 | * | 10/2010 | Igarashi ............... | B23K 3/0623 427/126.1 |
| 2013/0147129 A1 | * | 6/2013 | Chiu ................... | H01L 21/6831 279/3 |
| 2014/0079472 A1 | * | 3/2014 | Oppermann ......... | B23K 35/262 403/272 |

* cited by examiner

*Primary Examiner* — Peniel M Gumedzoe
*Assistant Examiner* — Christopher A Johnson
(74) *Attorney, Agent, or Firm* — Don Halgren

(57) ABSTRACT

A system for the flux free processing of a plurality of solder balls on a wafer, comprising: an articulable vacuum support chuck for maintaining support of a plurality of solder balls on a wafer being processed. An articulable flux-free binder applicator arranged in binder depositing relationship with the wafer within the treatment chamber. An articulable fluid dispenser is arranged in a binder-applied minimization-treatment with respect to the flux free binder applied to the wafer within the treatment chamber.

14 Claims, 19 Drawing Sheets

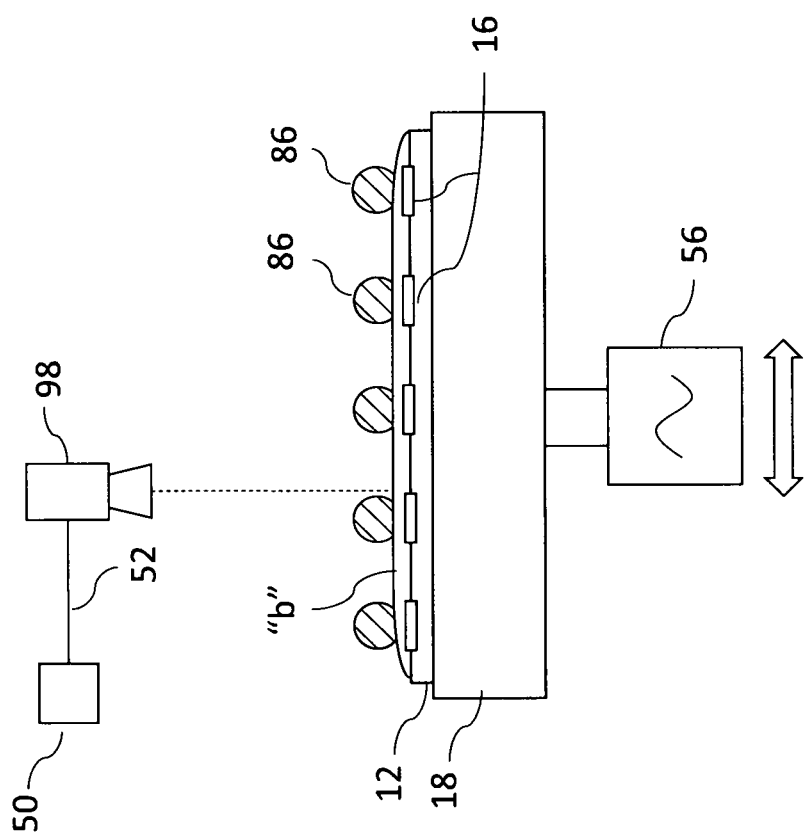

FLUX-FREE SOLDER BALL MOUNT ARRANGEMENT

FIELD OF THE INVENTION

This invention relates to arrangements for the manufacture of wafer, substrate, PCB or panel substrate chips with solder balls attached thereto, and more particularly to devices for placement processing of wafers with a flux-free binder in a solder ball mount arrangement (which current non provisional application is based upon provisional application 62/605,277, filed on 7 Aug. 2017), prior to that solder ball arrangement being heat processed in a flux free solder reflow or solder ball join arrangement which is described in a sister provisional application (62/605,288, filed 7 Aug. 2017) each of which provisional application, and the non-provisional sister application Ser. No. 15/998,295, filed 1 Aug. 2018, are all incorporated herein by reference in their entirety.

BACKGROUND OF THE INVENTION

Solder ball mount machines typically have a process flow wherein a wafer is picked up by a robot arm and placed onto a flux station. A mask would be aligned for bump pads on the wafer through alignment marks at that station. Flux would be applied through the template or mask. Flux is opaque and hence ball mount alignment marks would be covered by a flux alignment template to prevent flux from coating the ball mount alignment mark. The mask would be aligned to the wafer by ball mount alignment marks using an optical vision arrangement at the solder ball mount station. The wafer, after inspection would be placed into the processing chamber. Contamination is common. The flux, being opaque thus requires several sets of templates and masks. Multiple sets of alignment mechanisms are needed.

It is an object of the present invention to overcome the contamination, the wasted material and the excessive time disadvantages of the prior art.

It is a further object of the present invention to shorten the process steps, and expense of the prior art systems.

It is yet a further object of the present invention to provide a wafer processing chamber which utilizes optics to insure deposition of solder balls at their proper location and which also utilizes optics to identify and locate any solder ball misplacement.

It is still yet a further object of the present invention to provide a sweeping mechanism to eliminate and reclaim any oversupply of binder upon a wafer arrangement.

BRIEF SUMMARY OF THE INVENTION

The present invention comprises an initial assembly module arranged to process to enable the flux free attachment of a plurality of solder balls to a wafer for use in the electronics industry, the process comprising: depositing a flux free binder on a wafer; blowing compressed dry air over the flux free binder on the wafer to control the depth of the flux free binder thereon; depositing an array of solder balls onto the flux free binder on the wafer through an array of holes in a stencil arranged over the wafer; lowering an array of looped wires attached to a bottom side of the ball mount head into the array of solder balls on the stencil above the wafer; vibrating the array of looped wires in the array of solder balls on the stencil above the wafer; blowing compressed dry air over the array of solder balls on the stencil to displace any stray excess solder balls on the stencil above the wafer; and vacuuming up and collecting any stray excess solder balls displaced by the blown compressed dry air thereover. The process includes: depositing the array of solder balls onto a stencil above the wafer by dropping a number of solder balls from the ball mount head onto the stencil; supporting the wafer on a three zone vacuum chuck to hold the wafer securely thereon; arranging an array of vertically displaceable support pins within the three zone vacuum chuck so as to enable the lowering of the wafer onto the vacuum chuck in a controlled manner by a pneumatic pin control process. The initial assembly module is followed by further treatment, as for example, heat treatment in a further wafer/pad treatment module.

The invention also comprises a system for the flux free processing of a plurality of solder balls on a wafer in a wafer treatment process containment chamber, the system comprising: an articulable vacuum support chuck for maintaining support of a wafer containing a plurality of solder balls as the wafer is being processed within the process containment chamber; an articulable flux free binder applicator arranged in binder depositing relationship above the wafer within the process containment chamber; and an articulable curtain-of-fluid dispenser arranged in binder-applied minimization treatment relationship with respect to any flux free binder applied to the wafer within the process containment chamber for applying a curtain of fluid onto the wafer, wherein the curtain of fluid is compressed air. The term "wafer" used herein may also be called a wafer chip, substrate or panel as would be utilized in the electronics industry.

The articulable curtain-of-fluid dispenser preferably comprises an array of air-ejecting-nozzles movably arranged over the wafer being treated. The air ejecting nozzles and the articulable flux free binder applicator are both preferably supported on a common gantry frame arrangement. The system includes a vacuum utilizing excess-solder-ball collecting vessel arranged adjacent the wafer being treated to collect any excess solder balls not properly arranged on the wafer via transfer through holes in the stencil. The system also includes a camera arrangement insertable within the process containment chamber or module, to inspect and analyze the treated wafer for solder ball placement accuracy subsequent to the removal of excess solder balls by the excess-solder-ball collecting vessel.

The invention also comprises an optical control system for solder ball attachment to a wafer during its processing in a wafer processing chamber, the system comprising: an overhead frame member supporting an arrangement of overhead sensors in an upper end of a wafer processing chamber; a lower articulable solder ball and wafer vacuum support chuck; and an articulable stencil mask arranged between the chuck and the arrangement of overhead sensors, wherein the overhead sensors monitor the alignment of solder balls on the wafer through the articulable stencil mask during ball alignment processing thereof. The overhead sensors are mounted on overhead gantry frame arrangement, wherein the overhead sensors are movable in the X and Y directions. Each of the overhead sensors comprises a camera with a lens assembly, a light sensor and artificial light source. The wafer vacuum support chuck is first positioned at a vertical distance below the cameras so that the wafer is in focus and wherein the cameras take multiple images of the wafer for transmission to a control computer. The invention also includes a pad alignment arrangement to reorient any non-aligned pads with respect to the articulable stencil mask arranged thereabove.

The invention also includes a method of treating a plurality of solder balls on a wafer in a wafer treatment processing containment chamber, the method comprising: lifting a pad loaded wafer by a robotic arm into the wafer treatment processing containment chamber or module; supporting the pad loaded wafer within the wafer treatment processing containment chamber by a plurality of vertically movable support pins extending from an articulable vacuum chuck arranged within the wafer treatment processing containment chamber; securing the pad loaded wafer onto a plurality of vacuum cups each arranged on the uppermost end of the vertically movable support pins, by a vacuum therethrough; retracting the movable support pins into the articulable vacuum chuck; applying a further vacuum from a plurality of vacuum channels in the articulable vacuum chuck, to a bottom side of the pad loaded wafer secure the pad loaded wafer thereto; depositing a flux free binder across an upper surface of the pad loaded wafer supported on the articulable vacuum chuck; blowing a curtain of compressed dry air across the binder laden upper surface of the pad loaded wafer; arranging a hole-laden stencil above the surface of the pad loaded wafer; dropping a plurality of solder balls from a ball mount head supported above the pad loaded wafer and onto the pad loaded wafer; blowing a further curtain of compressed dry air over the solder balls on the wafer to eliminate excess solder balls on the wafer; and vacuuming and collecting excess solder balls from the pad loaded wafer which are unaligned and not received within holes in the hole-laden stencil; and removing the pad loaded wafer from the pad loaded wafer treatment containment chamber for processing in a further treatment chamber. The method includes the steps of: lowering a vibratory sweep arrangement to a location above the pad loaded wafer and hole-laden stencil within the wafer treatment containment chamber; vibrating the sweep arrangement over the pad loaded wafer with its solder balls thereon to insure placement of solder balls within a hole in the hole-laden stencil; applying a vacuum along an edge of the stencil to enable collection of excess solder balls from the pad loaded wafer.

The invention also includes a process for the assembly of solder balls on a pad loaded wafer chip or substrate or panel in a wafer chip treatment application chamber, the process comprising the steps of: moving the wafer chip robotically into a wafer chip treatment application chamber; lowering the wafer chip onto an arrangement of pneumatically controlled support pins extending vertically upwardly from an articulable vacuum chuck; securing the wafer chip onto the articulable vacuum chuck by a plurality of vacuum channels therebetween; introducing a gantry frame supported binder spray nozzle and compressed air delivery nozzle arrangement into the wafer chip treatment application chamber; spraying a binder fluid from the binder spray nozzle across an upper surface of the wafer chip therebeneath; spraying a curtain of compressed dry air from the compressed air delivery nozzle onto the upper surface of the wafer chip to remove excess binder fluid therefrom; coarsely aligning the wafer chip on the articulable vacuum chuck; introducing a hole-laden stencil into the wafer chip treatment application chamber above the wafer chip; precisely aligning the wafer with respect to the stencil by an array of cameras supported on a gantry frame within the wafer chip treatment application chamber; verifying the alignment of the stencil with respect to the wafer chip by a verification camera supported on a gantry frame within the wafer chip treatment application chamber; introducing an X, Y and Z direction displaceable ball mount head into the wafer chip treatment application chamber; dropping a plurality of solder balls onto the hole-laden stencil above the wafer chip; and vibrating the arrangement of looped wires onto the plurality of solder balls so as to induce the solder balls into the holes of the hole-laden stencil on the surface of the wafer chip; blowing a curtain of compressed dry air across the hole-laden stencil to move excess solder balls to the edge of the stencil; vacuuming up excess solder balls and storing them for later use. The process includes the steps of: blowing a curtain of compressed dry air across the binder to remove excess binder from the wafer; and aligning solder balls on the minimized binder on the wafer.

The invention also comprises a wafer chip assembly arrangement for use in the semiconductor industry, wherein a portion of the wafer chip assembly includes an alignment process in a production module, including the steps of: supporting a pad laden chip on an articulable chuck; moving the articulable chuck and pad laden chip underneath a hole-laden stencil; holding the hole-laden stencil in a fixed position on a base plate, wherein the holes define a unique hole pattern; supporting a pair of imaging cameras within the module and over the stencil; capturing at least two images of at least some of the holes of the unique hole pattern in the hole-laden stencil; and transmitting the images of the unique hole patterns to a control computer for storage and analysis. The wafer chip assembly process may include: identifying a subset of holes from the images as a composite feature; memorizing the precise position of the composite features on the stencil by the control computer in terms of a global coordinate system, wherein the coordinate system is fixed with respect to a base plate stationary element; positioning a pair of alignment cameras over an alignment window; capturing an image of a pad laden wafer by each of the alignment cameras; analyzing the image captured by the alignment cameras by the control computer; comparing the images captured by the imaging cameras and the alignment cameras to determine relative orientation between the holes in the stencil and the pad laden wafer on the articulable chuck; and moving the articulable chuck supporting the pad laden wafer into proper positioning beneath the hole laden stencil, to await solder ball deployment thereon.

BRIEF DESCRIPTION OF THE DRAWINGS

The objects and advantages of the present invention will become more apparent when viewed in conjunction with the following drawings, in which:

FIG. 16 depicts optical inspection the loaded wafer its plurality of pads and mounted solder balls arranged a thereon.

DETAILED DESCRIPTION OF THE INVENTION

Figure 1:
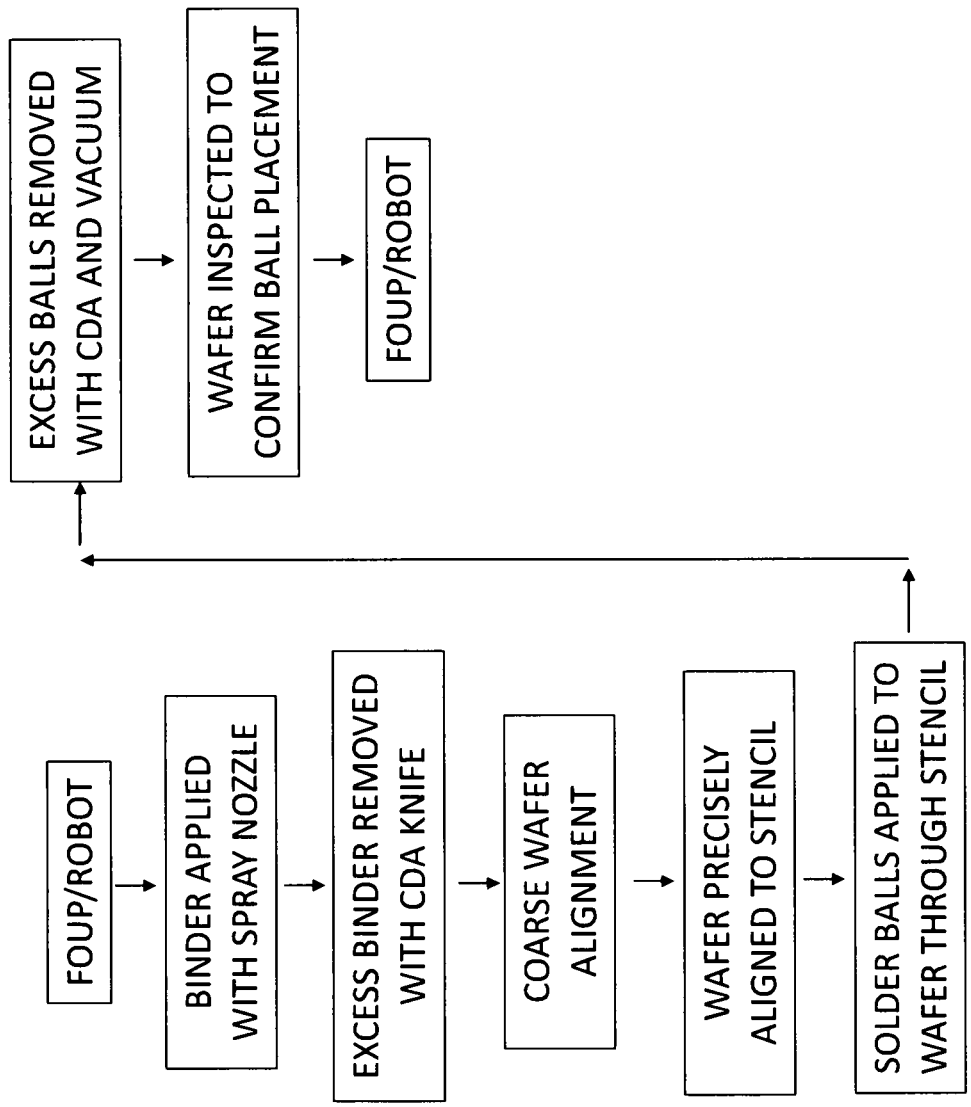
FIG. 1 represents the steps of the process utilizing the construction and principles of the present invention.

Referring now to the drawings in detail, and particularly to FIG. 1, there is shown a schematic representation of the present invention as it relates to a fluxless solder ball mount assembly process module with a shortened assembly procedure which procedure will subsequently require a vertically configured heat treatment arrangement, as described in a sister application. The process as generally recited in FIG. 1 is more specifically described as follows: a FOUP (front operating unified pod container) having a robotic arrangement which loads a pad-loaded wafer into a treatment chamber; a liquid binder is applied to the upper surface of the wafer; excess binder is driven off the chip by a curtain of compressed dry air leaving only a thin film thereon; the wafer is coarsely adjusted with a pre-aligner robotic arm and loaded onto a vacuum support chuck; an optomechanical system aligns the wafer precisely to one aligned fixed stencil; solder balls are applied through holes in the stencil and onto binder coated pads on the wafer; excess balls are removed with a further sweeping application of compressed dry air, the excess balls being retrieved by a vacuum suction system there adjacent; and the wafer is then optically inspected to confirm or if needed, correct ball placement. The properly loaded wafer would then be withdrawn by the robotic arm for subsequent treatment in a further module.

Figure 2A:
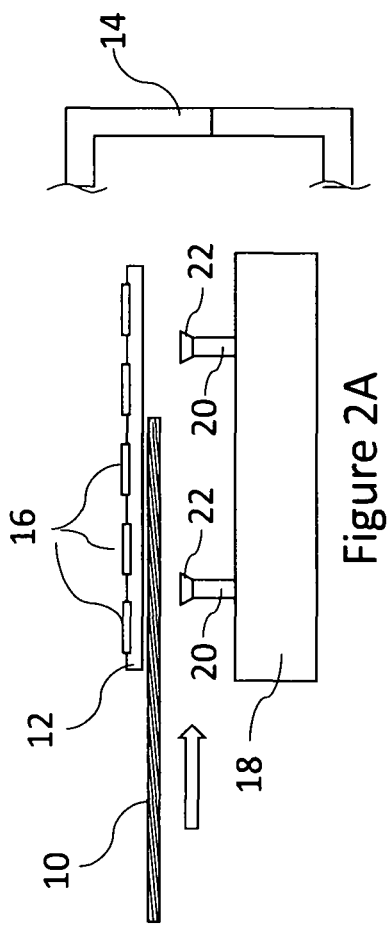
FIGS. 2A, 2B and 2C show in a side view the robotic process of loading a wafer onto a support chuck and its securement thereon.
Figure 2B:
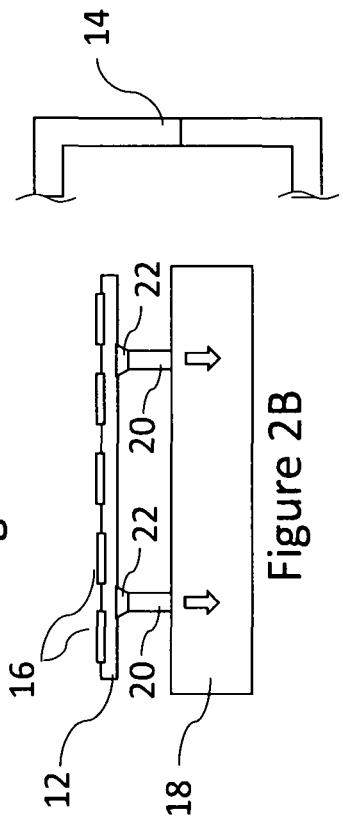
Figure 2C:
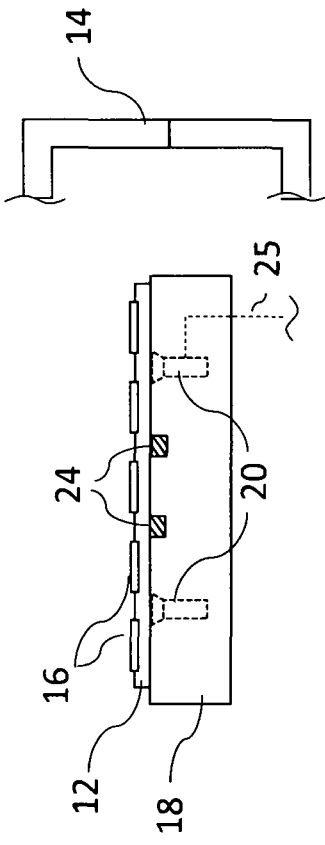

The above-recited process is more specifically depicted in the following figures, beginning with the side elevational view shown in FIG. 2A, wherein a robotic arm 10 is shown delivering a wafer 12 into a temperature and humidity controlled application chamber 14. The wafer 12 is pre-loaded with a plurality of solder ball receiving pads 16. A 3-independent-zone vacuum chuck 18 is also arranged within the application chamber (module) 14. A plurality of support pins 20 extends from the upper surface of the support chuck 18. The support pins 20 are vertically displaceable and have a vacuum cup 22 arranged on their uppermost or distal end, as may be seen in FIGS. 2A and 2B. The robotic arm 10 deposits the wafer 12 onto the upper ends of the support pins 20, as represented in FIG. 2B. The support pins 20, carrying the wafer 12 are preferably pneumatically withdrawn fully into the vacuum chuck 18 and become recessed pins 20, as represented in FIG. 2C. Once the wafer 12 touches the chuck 18 a plurality of vacuum channels 24 arranged within the chuck 18 are actuated to hold the wafer 12 firmly in place. The vacuum channels 24 are grouped into three zones across the surface of the chuck 18 each of which zone may be controlled independently of one another, by a proper computer controlled circuit 25.

Figure 3A:
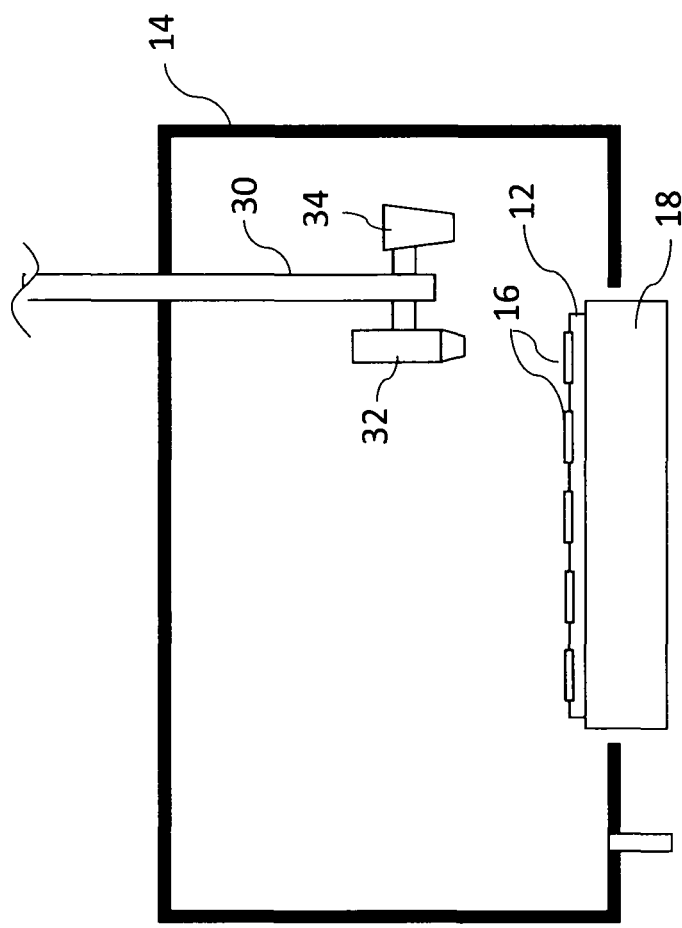
FIG. 3A shows a side elevational view of a loaded support chuck within an application chamber with a gantry controlled binder spray arrangement and an excess binder removal arrangement therewith.

The next step in the process as recited in FIG. 1, is represented initially in FIG. 3A wherein a side elevational view shows the application chamber 14 having a lower end whether the vacuum support chuck 18 residing thereat. A gantry frame 30 extends into and within the chamber 14, above the wafer 12, which is preloaded with its pads 16, the gantry frame 30 being movable controllably thereacross (either transversely or longitudinally, or both ways) thereacross by computer controlled servomotors. An array of binder spray nozzles 32 are arranged on the lower end of the gantry frame 30, enabled to spray a liquid binder "b" therethrough, via a conduit in the gantry frame 30 and onto the wafer 12 therebelow. An "air knife" 34 is also arranged on the lower end of the gantry frame 30, so as to also apply a computer controlled curtain of compressed dry air across the width of the wafer 12 thereinbelow, as necessary, by computer controlled movement of the gantry frame 30. Actuation of the gantry frame 30 scans the nozzles 32 and the air knife 34 over the wafer 12.

Figure 3B:
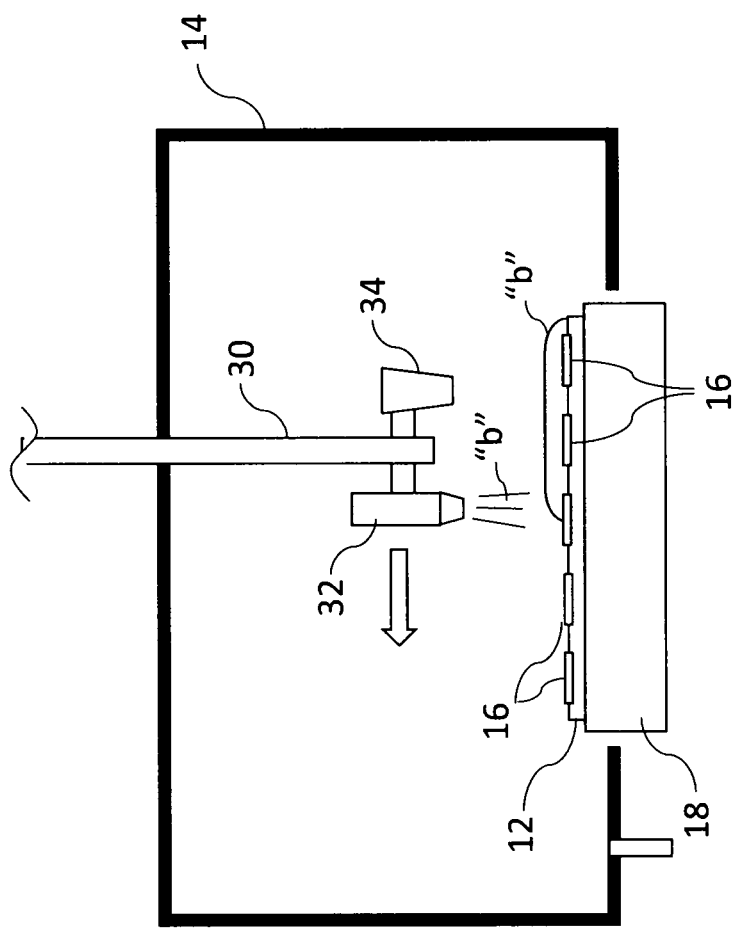
FIG. 3B shows the side elevational view represented in FIG. 3A wherein the gantry controlled binder spray arrangement is applying binder to the top surface of the wafer resting on top of the chuck.
Figure 3C:
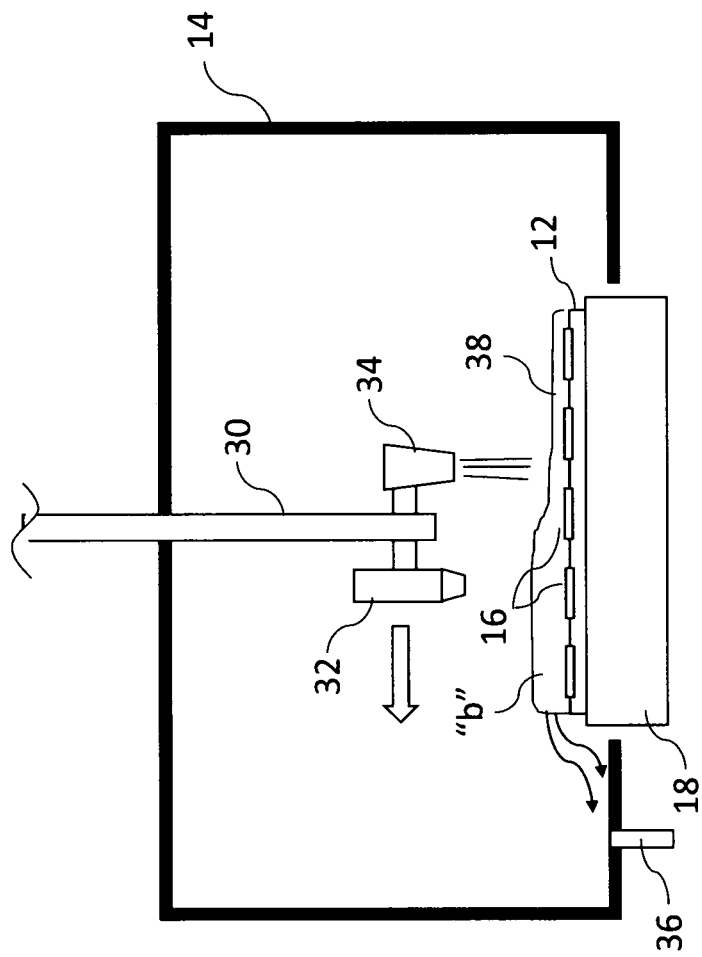
FIG. 3C shows the side elevational view represented in FIG. 3B wherein the gantry controlled excess binder removal arrangement functioning to remove excess binder applied thereto and the drainage of that excess binder from the application chamber.

FIG. 3B shows the binder "b", being sprayed upon the pad loaded wafer 12, meaning both the wafer 12 and the pads 16, as the gantry frame 30 traverses the breath of the wafer 12 therebeneath. It is to be noted that the binder "b" is shown having an excessive accumulation on the wafer 12 and possibly on the pads 16, as viewed on the right hand side of FIG. 3B. FIG. 3C represents the traversal of the gantry frame 30 above the binder coated wafer 12 therebeneath.

The gantry frame 30 in FIG. 3C depicts the air knife 34, preferably comprised of an array of nozzles 92, (described further hereinbelow), sweeping a curtain of humidity and temperature controlled compressed dry air across the surface of the binder laden wafer 12 supported on the vacuum chuck 18. The compressed dry air may be blown perpendicular to or angled with respect to the horizontal surface of the wafer 12. The mechanical and/or evaporative action of the compressed dry air blown curtain or stream drives excess binder off of the wafer 12, as shown in the left hand side of the application chamber 14 and into a collection vessel (not shown) through a lower drain port 36 therewithin. A thin film of binder 38 shown on the wafer 12 on the right hand side of the wafer 12, is represented in FIG. 3C. The thickness of that thinned binder film 38 may be controlled by controlling the flow rate of the compressed dry air, the scan speed of the gantry frame 30, the position of the air knives 34 or their nozzle shapes.

Figure 4A:
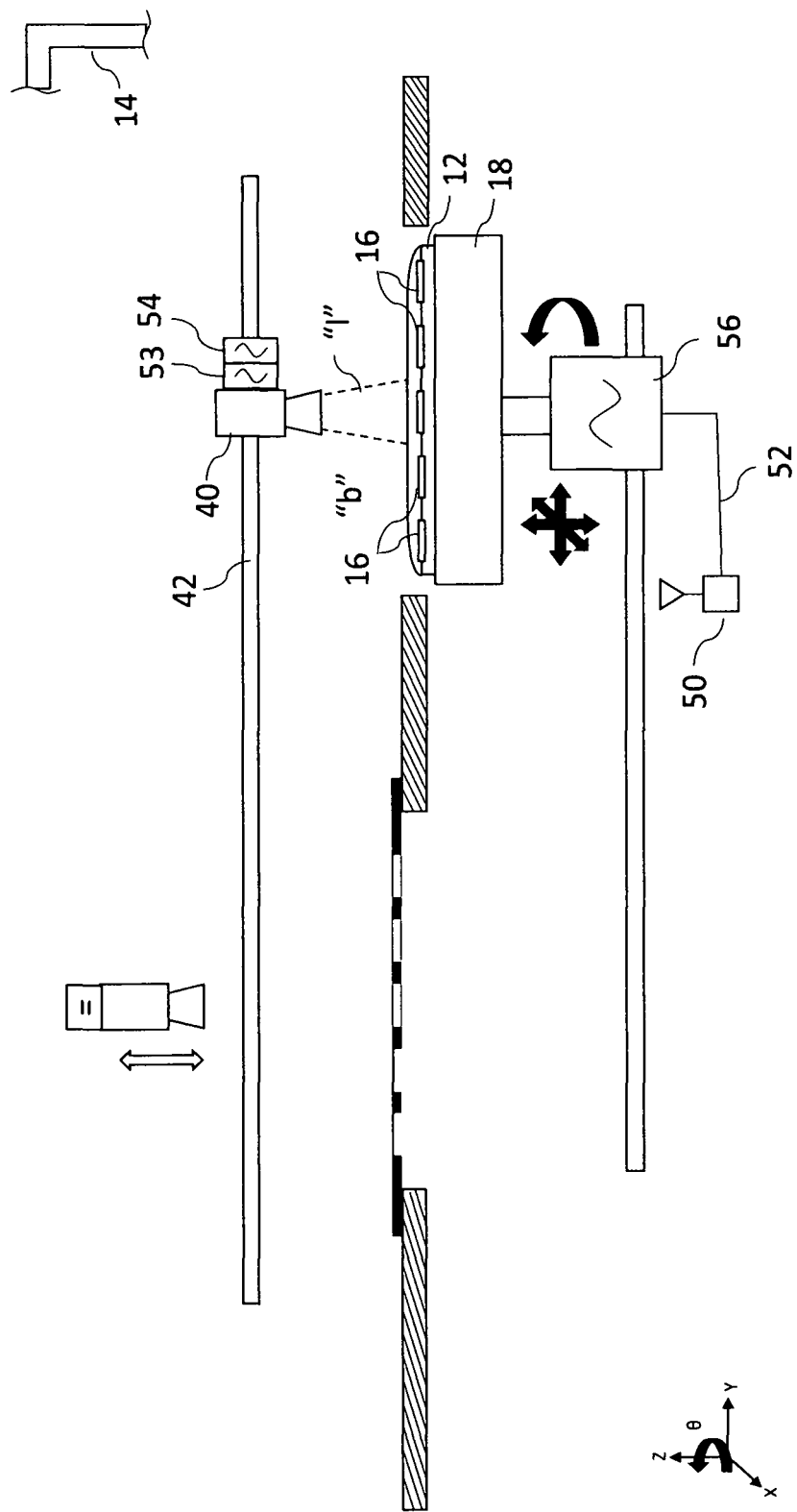
FIG. 4A shows a side elevational view of a pad-loaded wafer being properly aligned on a rotationally controlled vacuum chuck by operation and control, through a proper circuit, of a plurality of alignment control cameras.
Figure 4B:
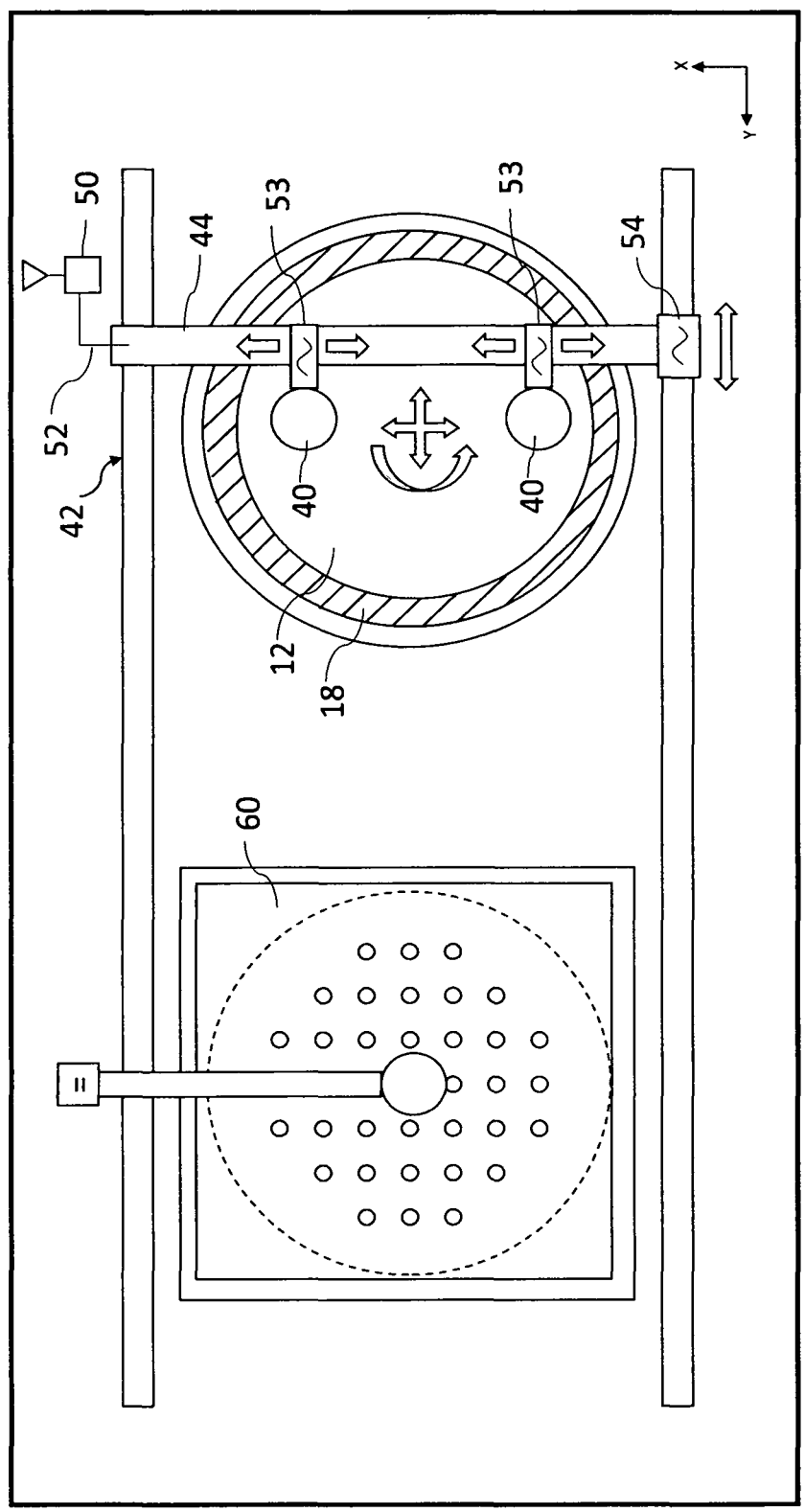
FIG. 4B shows a plan view of the chuck-supported wafer shown in FIG. 4A wherein the alignment control cameras are themselves controlled by servo motors in an overhead beam/gantry arrangement.

A side elevational view of the alignment process of the wafer 12, held by the vacuum support chuck 18, the wafer 12 and its respective pads 16 are all being represented in FIG. 4A, the pads 16 having received their thin film of binder "b". An alignment camera arrangement 40 is arranged within the application chamber 14, on a gantry frame arrangement 42, the camera arrangement 40 being movably controlled in the X and Y directions on that gantry frame arrangement 42, by servomotors 53 and 54. Each alignment camera 40 is comprised of a lens assembly, a light sensor or and an artificial light source. The vacuum support chuck 18 also shown in FIG. 4A is supported, and may be actuated by a multi-axis stage 56 in the X, Y, and Z directions and may be rotated in the theta direction (about the z-axis) through interaction by the control computer 50. The chuck 18 is $1^{st}$ positioned a vertical distance below the cameras 40 such that the wafer 12 is in focus as is shown in FIG. 4B. The cameras observe the wafer 12 through the alignment window, an opening 55 in the base plate 57. An alignment beam "I" represents the camera's "field of view" in FIG. 4A emanating from one of the pair of alignment cameras 40 directed downwardly onto the array of pads 16 therebeneath. A separately supported and controlled verification camera 62 is also shown in FIG. 4A to be described further hereinbelow.

FIG. 4B shows a pair of alignment cameras 40 mounted on a transverse beam 44 as part of the gantry frame 42, and are computer controlled so as to move independently on that transverse beam 44 in the X direction. The beam 44 itself is actuated in the Y direction, but is parallel to the X direction. Each camera 40 is preferably comprised of a lens assembly, a light sensor and artificial light source for this process of component alignment, the vacuum chuck 18 being initially positioned at a vertical distance below the cameras 40, such that the surface of the wafer 12 is in focus. Each camera 40 then is programmed to capture an image of a different position on the wafer 12 and sends these images to the control computer 50 via a proper circuit 52. This visual information is processed through the control computer 50, to indicate the precise position of the wafer 12 on the vacuum chuck 18. Upon determination of the precise position of the wafer 12, the stage 56, through circuit 52, actuates the chuck 18 as instructed to align the wafer 12 in the proper X, Y and Theta orientation, as represented in FIG. 4A such that only a single additional translation step is needed to align the pads 16 of the wafer 12 directly below corresponding holes 72 on a ball stencil 60, represented in FIG. 5 in FIGS. 6A and 6B described hereinbelow.

Figure 5:
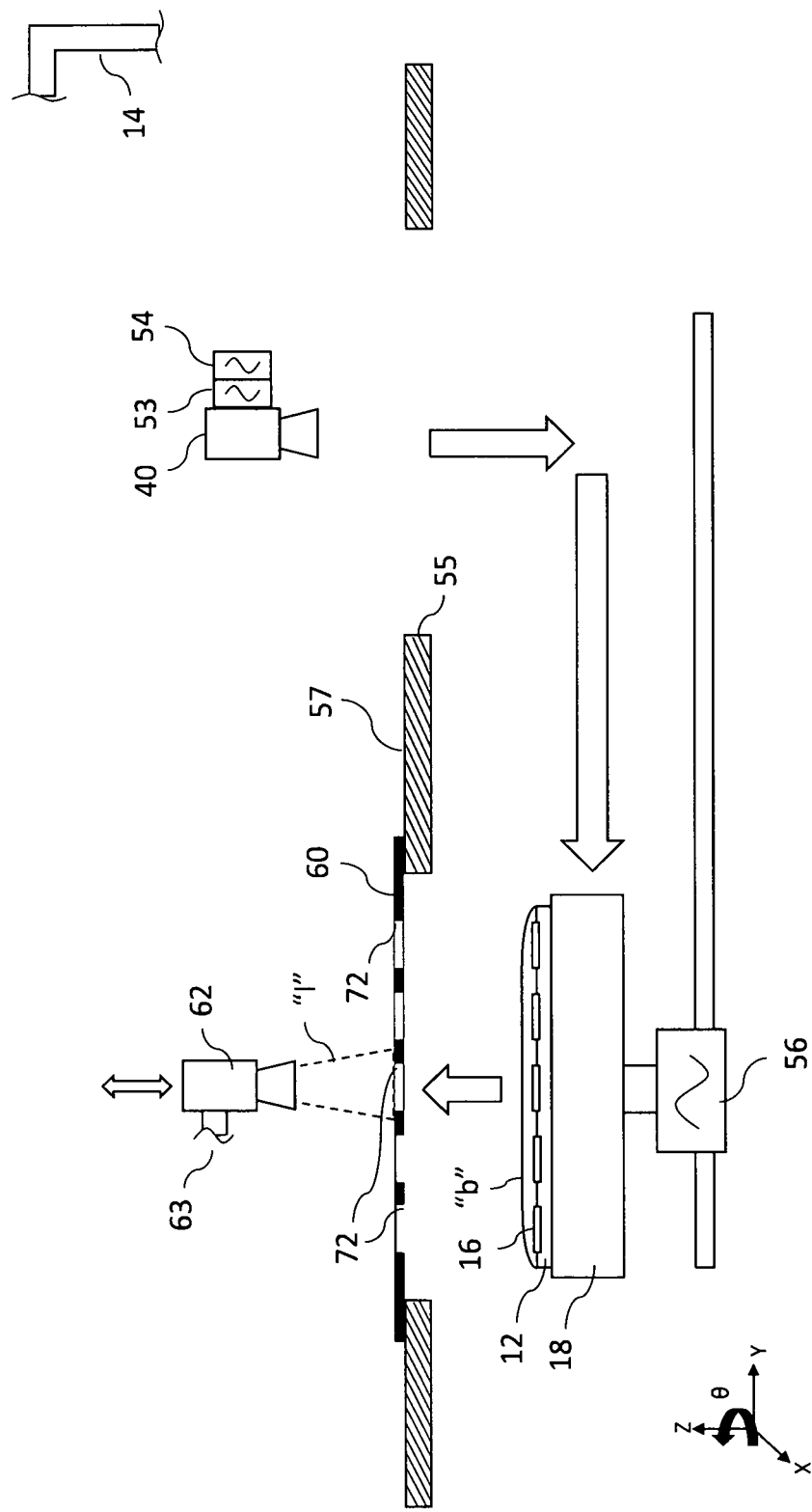
FIG. 5 shows, in a side elevational view, the chuck with a wafer vacuum-held thereon with a holed-alignment stencil thereover, being observed and controlled by an overhead verification control camera arrangement.

There is a hole-laden or holed-ball stencil 60, mentioned hereinabove, shown in a side elevational view in FIG. 5, arranged within the chamber 14 above a vacuum support chuck 18. The vacuum support chuck 18 shown movably controlled by a stage 56 thereunder. A downward looking verification camera 62 is shown mounted above the ball stencil 60. The verification camera 62 may be movable vertically by proper computer control in the "Z" direction with the pneumatic support arrangement 63. The wafer 12 is first translated in the "Y" direction from its position below the alignment camera arrangement 40 to a position directly below the ball stencil 60 and the verification camera 62. The wafer 12 on the chuck 18 is then translated in the "Z" direction such that it contacts or nearly contacts the bottom of the ball stencil 60. Once the wafer 12 is raised up to the ball stencil 60 and the verification camera 62 is in its down position, the ball stencil 60 and the wafer 12 are within the focal plane of the verification camera 62. The computer controlled verification camera 62 is instructed to take an image of a single location on the wafer 12. The control computer 50 uses this information to confirm the final alignment between the wafer 12 and the ball stencil 60. Once confirmed, the verification camera 62 is lifted up by controlled lift pneumatic driver 63 and out of the way of the ball mount head 70, shown hereinbelow in FIGS. 6A and 6B and described therewith.

Figure 6:
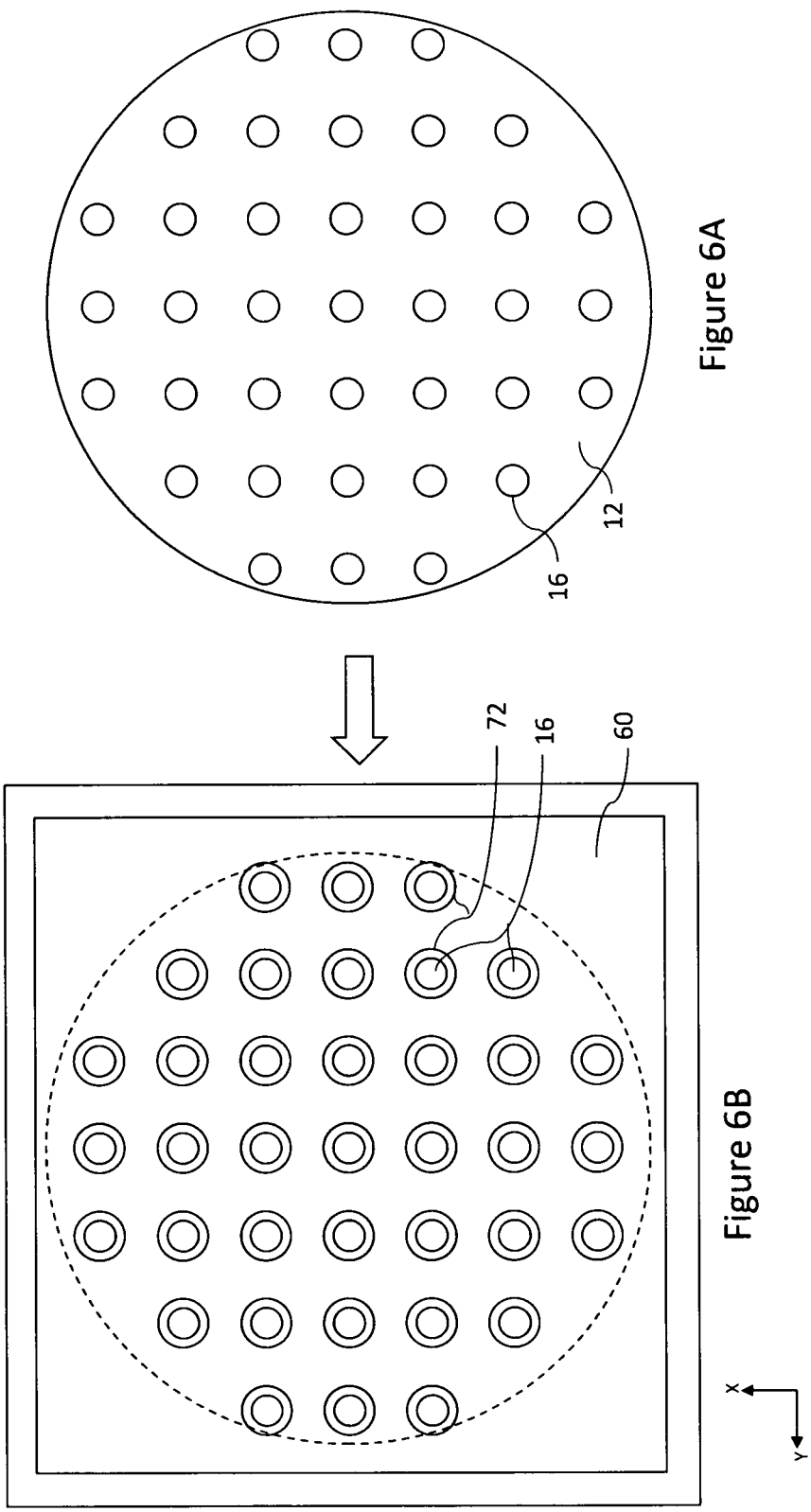
FIG. 6A depicts a wafer with the plurality of pads arranged a thereon, in a plan view.
FIG. 6B depicts the holed alignment stencil in alignment with the wafer arranged therebeneath.

Each of these pads 16 should end up centered in the X and Y directions under one of the holes 72 in the ball stencil 60. Arrangement between the wafer 12, its pads 16 and the holed-stencil 60 shown in FIG. 6A in plan view. The figure on the left, FIG. 6B shows the wafer 12 itself with a plurality of pads 16 neatly aligned thereon. FIG. 6A on the right shows the wafer 12 itself with its plurality of pads 16. The stencil 60 represented in FIG. 6B has a similar neatly aligned array of holes 72 thereon. When the wafer 12 is in proper alignment, each of these pads 16 should end up centered in the X and Y directions under one of the holes 72 in the ball stencil 60. The verification camera 62 is then instructed by the control computer to take a picture of a subset of these aligned pad 16 and holes 72. If all of the pads 16 and holes 72 within the camera's field of view are determined by the control computer 50 to be in proper alignment, then the entire wafer 16 is presumed to be properly aligned.

Figure 7:
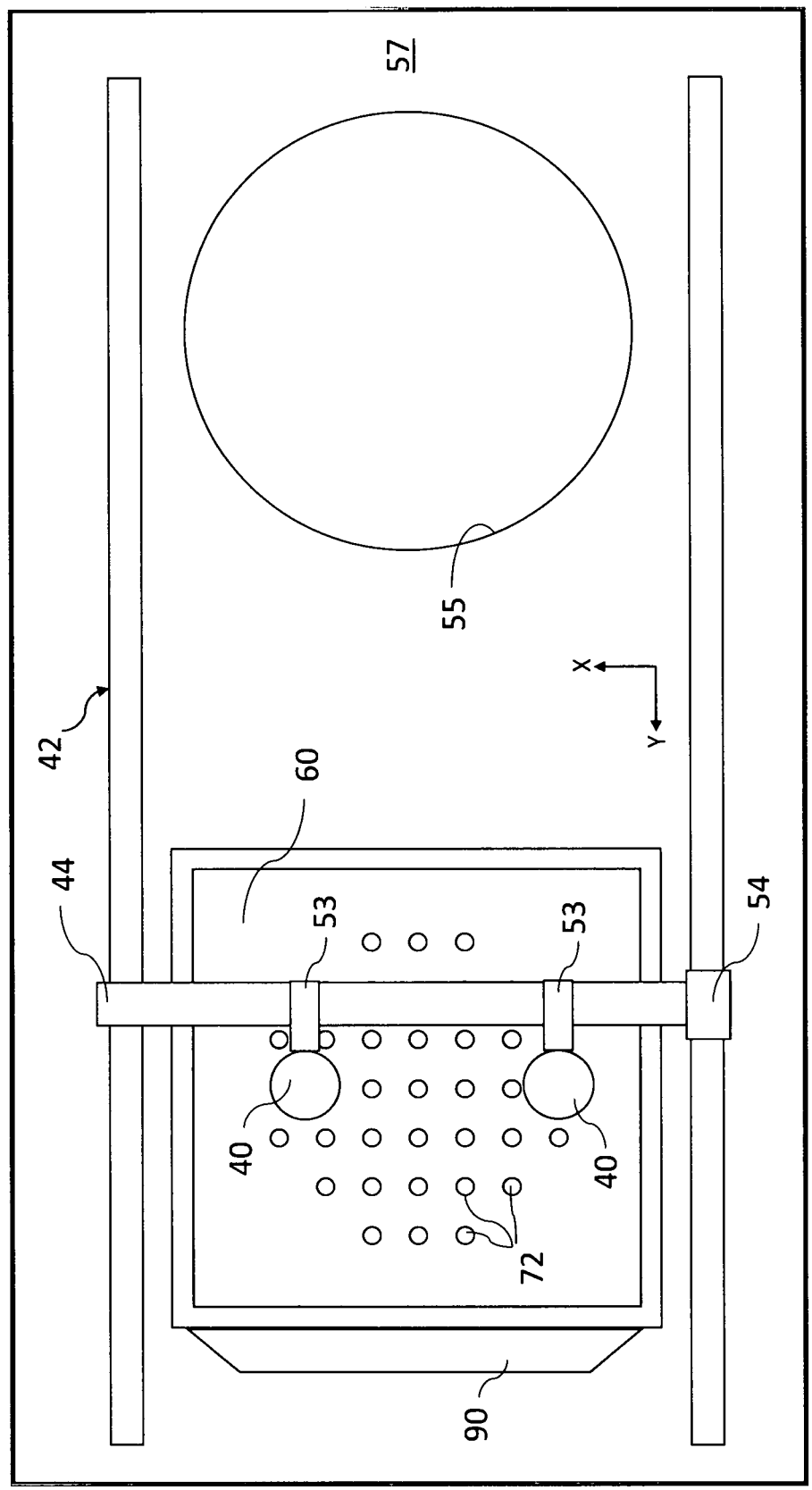
FIG. 7 shows in a plan view arrangement of alignment cameras mounted on a movable gantry supported over a stencil, the stencil held in a fixed position on a base plate.
Figure 9:
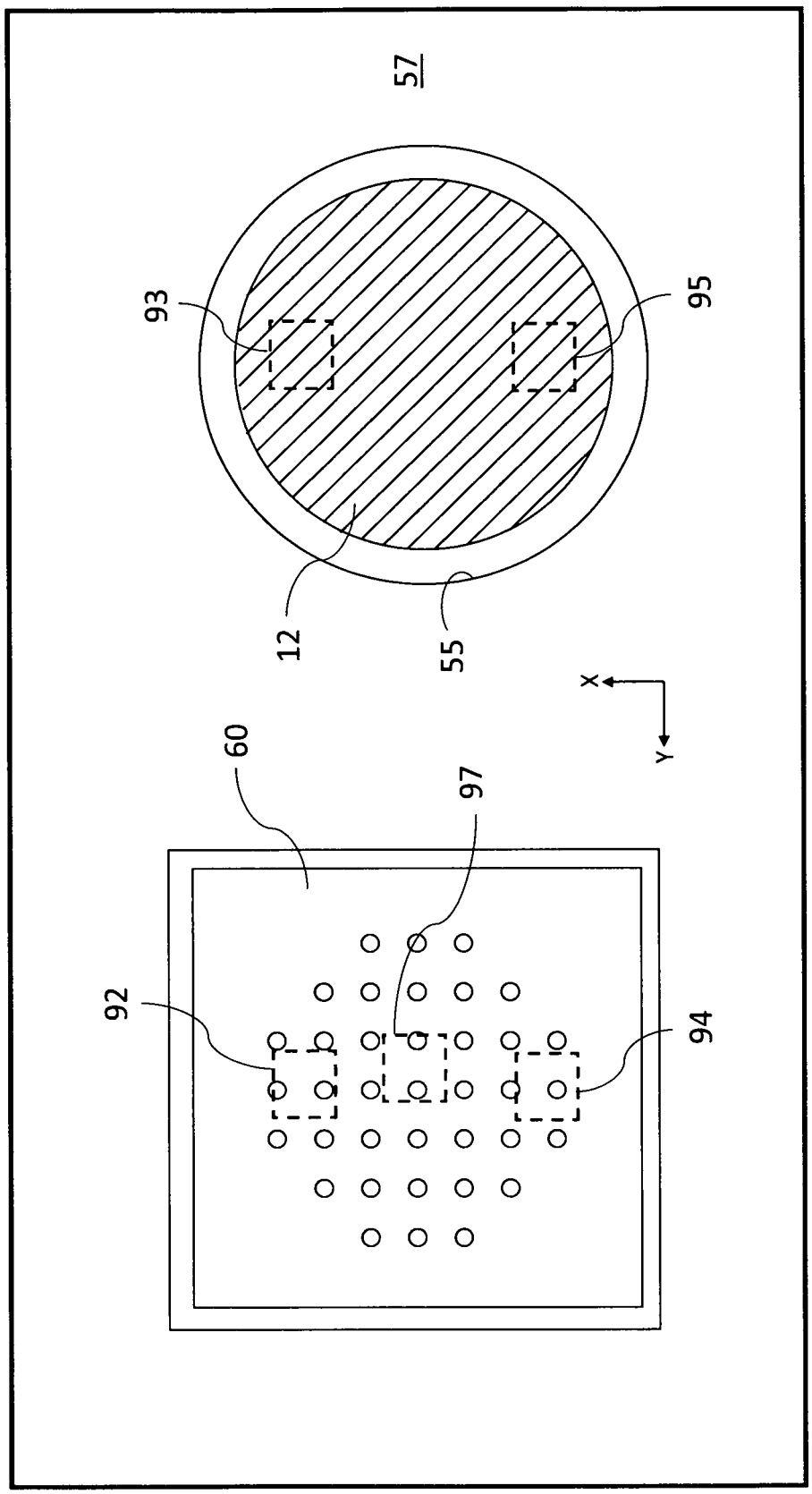
FIG. 9 represents, in a plan view, the wafer images taken by the alignment camera and of the stencil images taken by the alignment camera, each for further processing by the control computer and for subsequent alignment of the wafer, on its chuck, under the stencil.
Figure 10:
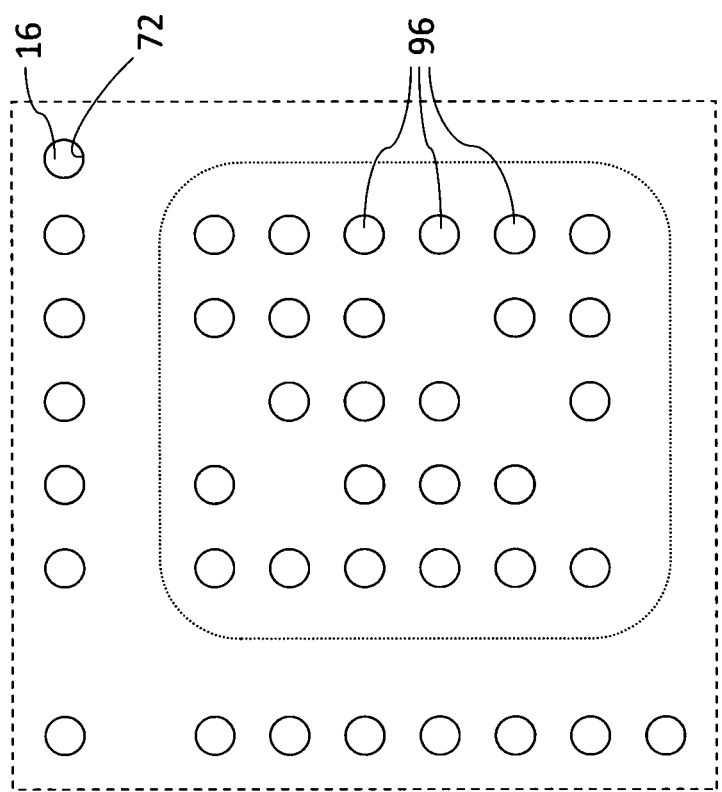
FIG. 10 represents the image of a plurality of stencil holes as taken by the alignment camera arrangement.

FIG. 7 displays the alignment process, wherein during the setup of the tool, before processing begins, the gantry frame 42 positions the two alignment cameras 40 over the stencil 60. The stencil 60 is held in a fixed position on the base plate 57 and remains fixed throughout its setup and processing. The stencil 60 contains a plurality of holes 72 and a unique hole pattern corresponding to the particular wafer 12 which will be processed. While each camera 40 (both of them) is over the stencil 60, each captures an image of the part of the stencil 60, which image is a section of the overall pattern of holes 72. These image sections are identified in FIG. 9 as stencil image #1 (92) and stencil image #2 (94). These image sections 92 and 94 are sent to the control computer 50 for storage and analysis. Each image captures a number of stencil holes 72 as shown in FIG. 10. In actuality, the number of holes 72 may be in the hundreds. Once the control computer 50 receives an image, this and software identifies a subset of holes 96 within the image 92 or 94 which form a unique pattern which will be referred to as a "composite feature". After this composite feature is identified, the vision software determines the precise position and orientation of the composite feature. The result is that during training, software identifies and memorizes the precise position of the two composite features on the stencil 60 in terms of a global coordinate system. This "global coordinate" is fixed with respect to stationary elements of the tool such as the base plate 57.

Figure 8:
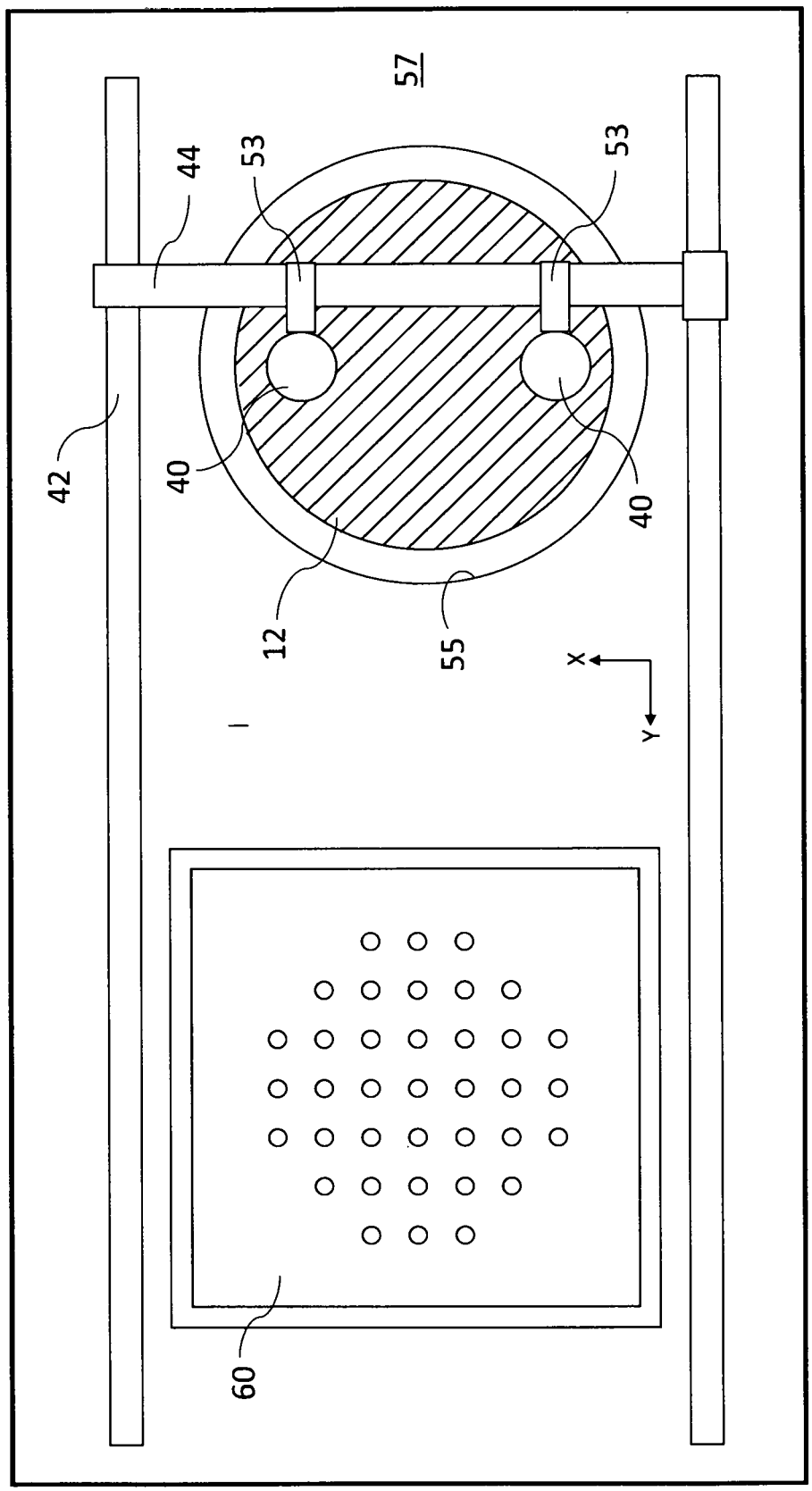
FIG. 8 shows in a plan view similar to FIG. 7 the arrangement of the alignment cameras supported and locked in position over a wafer.
Figure 11:
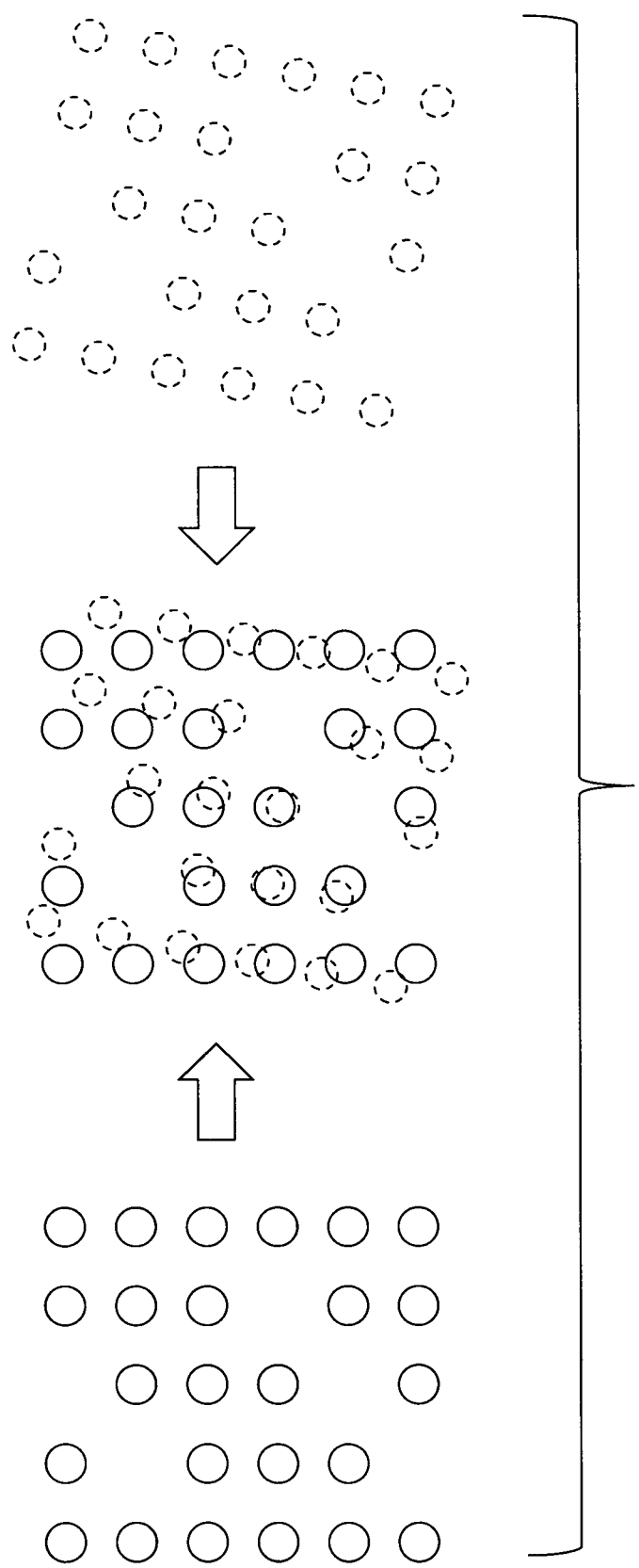
FIG. 11 represents the comparison of stencil image number 1 to wafer image number 1 and stencil image number 2 to wafer image number 2 to facilitate movement of the support chuck into alignment under the stencil.
Figure 12B:
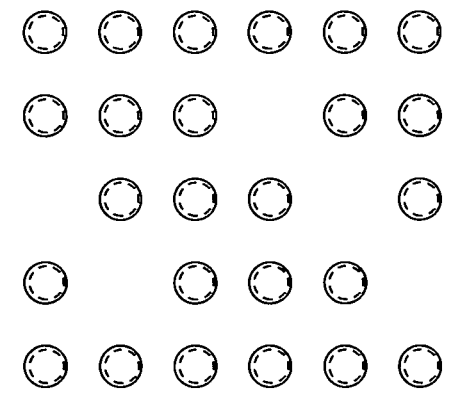
FIG. 12A depicts a composite of the misaligned features of the holes in the stencil and the pads on the wafer, and in FIG. 12B it represents the now-properly aligned relationship of the pad-laden wafer supported on its now properly positioned chuck.
Figure 12A:
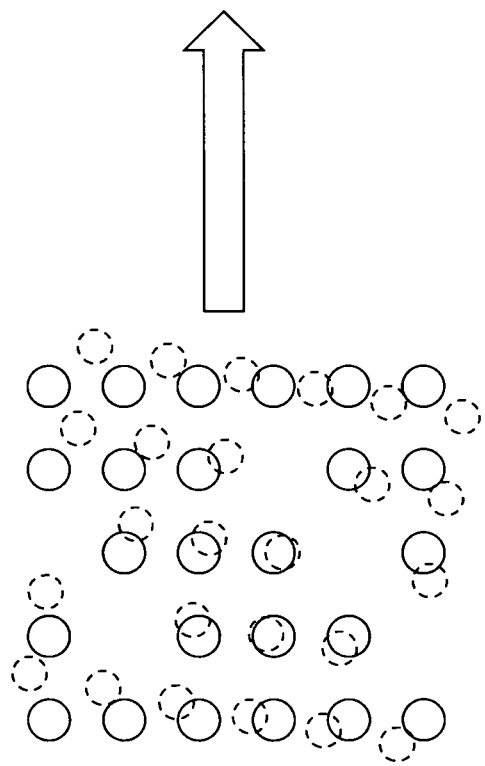

The gantry frame 44 then positions the alignment cameras 40 and 40 over the alignment window 55 as shown in FIG. 8. The camera positions are then locked in place and remain fixed all during processing and production of the wafer 12. When a wafer 12 is processed, it is loaded onto the support chuck 18 as represented in FIG. 4A and positioned under the alignment cameras 40 and 40. The wafer 12 contains a plurality of pads 16. Each camera 40 and 40 captures an image of part of the wafer 12, a section of the overall pad pattern. These image sections identified in FIG. 9 is wafer image #1 (93) and wafer image #2 (95). These images are then sent to the control computer 50 for analysis. Each image 93 and 95 may capture as many or more pads 16 as shown in FIG. 10. Once the control computer 50 receives an image 93 and/or 95, the vision software identifies a subset of pads 96 within the image 93 and/or 95 which form a unique pattern, a "composite feature' like that on the stencil 60. After the composite features are identified, the vision software now compares stencil image #1 (92) to wafer image #1 (93) and stencil image #2 (94) to wafer image #2 (95), this comparison being represented in FIG. 11. The software calculates the X, Y, Z and Theta motions that the support chuck 18 must make such of the final positions and orientations of each pair of the wafer stencil composite features will match as shown in FIG. 12B, the control computer 50 through the proper circuit 52, then commands the support chuck 18 to execute these calculated motions. The wafer 12 is thus aligned and brought upwardly near or into contact with the bottom of the stencil 60.

Figure 13B:
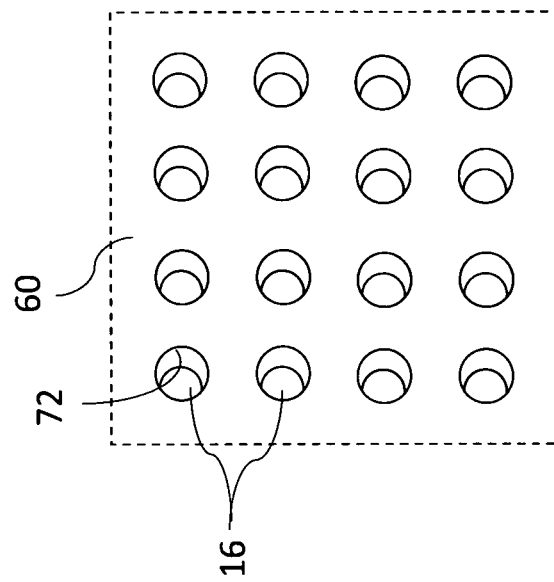
FIG. 13B represents a verification image of the wafer-stencil alignment as taken by the verification camera, showing an example of misalignment of the pad laden wafer beneath an array of stencil holes.
Figure 13A:
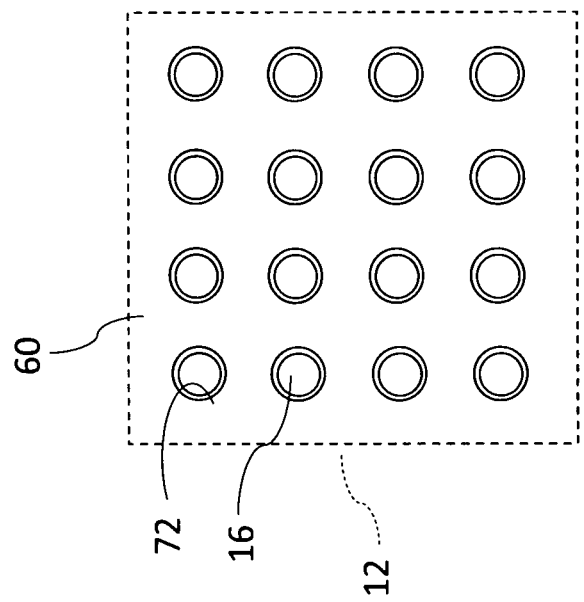
FIG. 13A represents the verification image of the wafer-stencil alignment, here showing proper alignment between the pads on a wafer and the stencil holes thereabove.

After the support chuck 18 finishes its motion and the wafer 12 is in position underneath the stencil 60, the wafer-stencil alignment must be confirmed. To do this, the verification camera 62 captures a single image of the stencil 60 and the wafer 12. This image is labeled "verification image" and 97 as represented in FIG. 9. As with the alignment cameras 40 and 40, the verification camera 62 captures a subset of the overall hole-pad pattern. The verification camera 62 sends this image to the control computer 50 where the vision software identifies the holes 72 and the pads 16 in that image. The vision software calculates the center of each pad 16 and of each hole 72, and compares them. Based on the relative position of the centers of the pads 16 and the centers of the holes 72, the software program determines whether the final alignment of the wafer 12 and stencil 60 is good as the verification image shown in FIG. 13A or as bad as the verification image shown in FIG. 13B. If the wafer 12 and the stencil 16 are perfectly aligned, the center of each pad 16 will match the center of a hole 72 as shown by the verification image shown in FIG. 13A.

Figure 14:
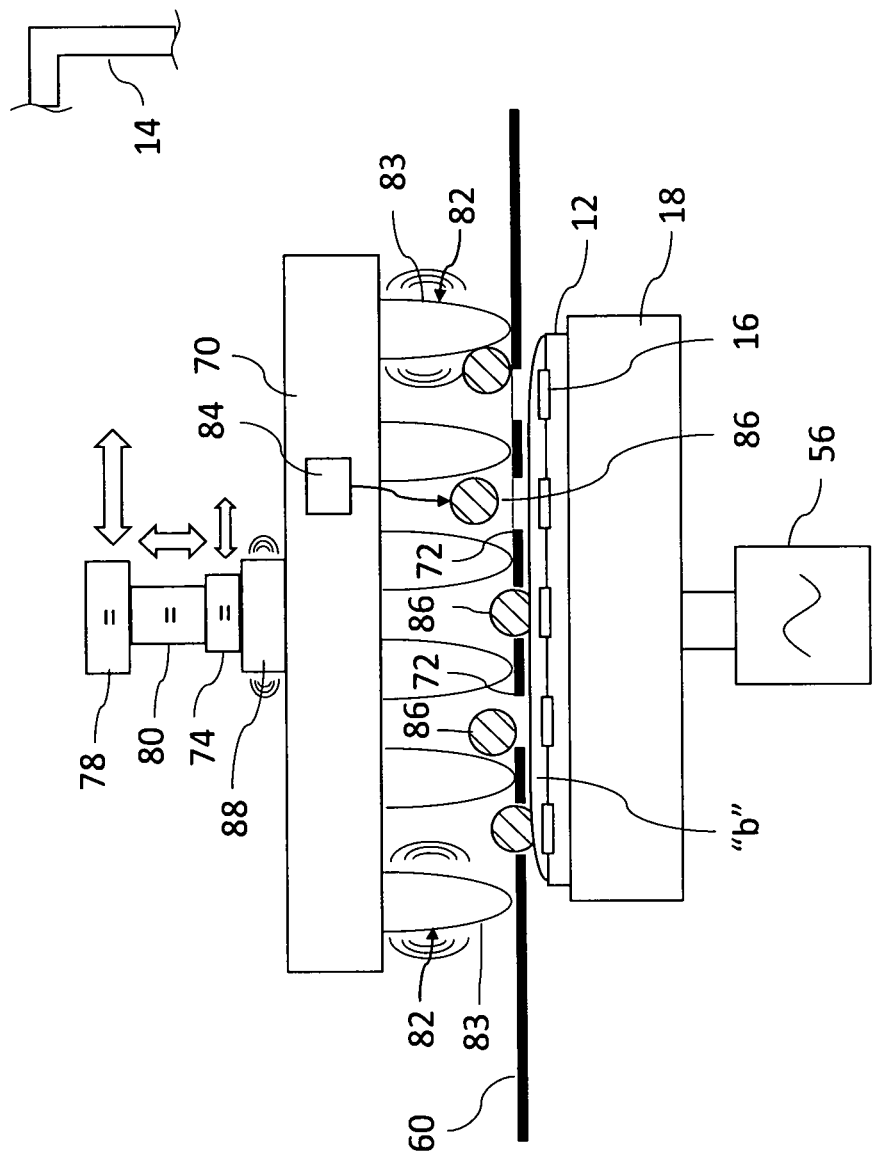
FIG. 14 represents the ball mounting process wherein the vacuum chuck with its pads and binder thereon, raised into touching engagement with the underside of the alignment stencil, with a plurality of solder balls being coaxed into their proper locations on the pads on the wafer by a ball mount head arranged thereover.
Figure 15:
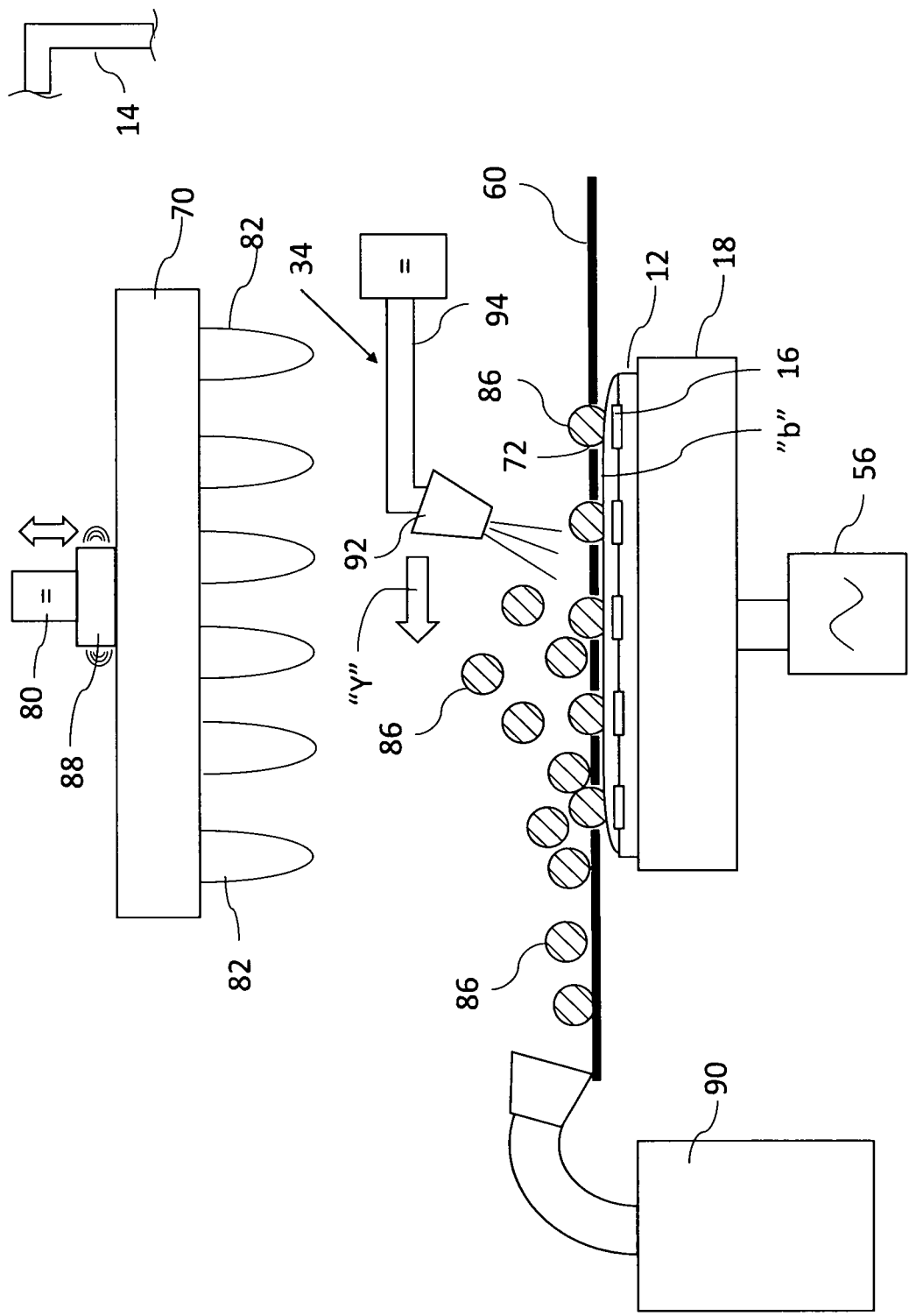
FIG. 15 depicts the excess solder ball removal by the excess solder ball removal arrangement sweeping there across and the recovery simultaneously of excess solder balls from the upper surface of the stencil.

The ball mounting process is represented in FIG. 14, wherein the wafer 12 has been raised up to the bottom of the stencil 60, as represented in FIGS. 14 and 15. The ball mount head 70 is robotically brought into the application chamber 14 through a side thereof, and is controllably lowered into proximity of the holes 72 in the stencil 60, the ball mount head 70 being computer controlled by a "coarse" "Y" direction pneumatic control arrangement 78 and a "Z" direction pneumatic control arrangement 80. A "fine" "Y" direction pneumatic control arrangement 74, represented in FIG. 14, is discussed further hereinbelow. The coarse "Y" direction pneumatic control arrangement 78 moves the ball mount head 70 out of the way of the verification camera 62. The ball mount head 70 in one preferred embodiment is an array of transversely extending sweep members 82, in one preferred embodiment, consisting of thin coils or loops of wire 83, attached onto the underside of the ball mount head 70. In another preferred embodiment, thin flexible brushes (not shown for clarity of the drawings) replace the coils or loops of wire 83 on the underside of the ball mount head 70. Those sweep members 82 or more specifically, those loops of wires 83 underneath the ball mount head 70 nearly contact or just barely contact the stencil 60. A reservoir 84 within the ball mount head 70 is programmed to release a volume of solder balls 86 which is thus dispersed across the upper surface of the stencil 60. A wave generator 88 is actuated by the control computer 50 through the proper circuit 52, to begin vibrating the sweep members 82, preferably loops of wire 83, in brushing contact with the solder balls 86 on the surface of the stencil 60. The brushing vibration of the wires 83 (or sweep member 82 brushes) contact the solder balls 86 and the vibration of the wires 83 results in movement of the solder balls 86. As the solder balls move over the stencil 60, they drop through the holes 72 in the stencil, and stick to the binder "b" coated wafer pads 16 properly arrayed therebeneath. Distribution of the solder balls 86 and filling of the holes 72 in the stencil 60 is further encouraged by oscillating the wires back and forth a different dimension, as for example, only several millimeters of oscillation using the fine "Y" pneumatic controlled driver 74 mounted on the ball mount head 70, in conjunction with the other separate drivers 78 and 80, again, represented in FIG. 14 mounted on the ball mounted head 70. After the solder balls 86 have been distributed amongst the holes 72 in the surface of the stencil 60, the ball mount head 70 is controllably effected to move up and out of the way of the compressed dry air sweep detailed hereinbelow in FIG. 15.

The solder ball sweep and recovery discussed earlier is shown again in FIG. 15. Once the solder balls 86 filed through the holes 72 in the stencil 60, and are stuck onto the binder-laden pads 16 situated on the wafer 12, the air knife 34 is actuated to sweep over the surface of the solder ball laden stencil 60, thus effecting a curtain of compressed dry air from its nozzles 92, as the air knife 34 is caused to move as it is carried by a pneumatically driven arm 94. Excess solder balls 86 not properly secured to a binder "b" on a pad 16 on the wafer 12 are driven before the curtain of compressed dry air sweeping across the solder ball laden stencil 60, effecting loose solder balls 86 towards a vacuum and collection vessel 90 at the downstream end of the compressed dry air sweep process. Thus, those solder balls 86 which did not fall into a receiving hole 72 in the stencil 60 are swept along before the air knife 34 (the compressed dry air nozzle arrangement 92) into capture by that collection vessel 90. Those solder balls 86 may be reused in further processing of additional wafers.

Optical inspection of the finally assembled wafer 12 is represented in FIG. 16. The wafer 12 having its proper array of pads 16 and multiple solder balls 86 is borne by the vacuum support chuck 18. A (line scan) camera 98, utilized for alignment scanning, comprising a lens assembly, a light sensor in an artificial light source, is arrayed downwardly while the vacuum support chuck 18 therebeneath supports the movement of the assembled wafer 12 through the field of view of the line scan camera 98 to create a composite image of the entire wafer 12. This image is processed by the control computer 50 confirming the alignment each solder ball 86 on the wafer 12 to determine if there are any missing or extra solder balls 86 which may have to be taken care of. A further embodiment of the present invention includes the multiple cameras described hereinabove by a single set of optics (cameras) to provide for both alignment and final inspection.

The invention claimed is:

1. A process to enable the flux free assembly of a plurality of solder balls onto an array of pads arranged on a wafer to comprise a wafer product, to enable the wafer product's use in the electronics industry, the process comprising:
    depositing a flux free binder on the wafer;
    blowing a curtain of compressed dry air over the flux free binder on the wafer to control the depth of the flux free binder thereon, and eliminate any excess binder thereon;
    arranging a displaceable hole-laden stencil over the wafer;
    aligning a pad-laden wafer to the hole-laden stencil;
    verifying that the aligned pad-laden wafer and the hole-laden stencil are aligned through a computerized optical vision system;
    depositing an array of solder balls onto the flux free binder on the wafer through an array of holes in the hole-laden stencil arranged over the wafer;
    lowering an array of sweep members attached to a bottom side of a ball mount head into the array of solder balls on the stencil;
    vibrating the array of sweep members in the array of solder balls on the stencil to further effect ball placement through the holes in the stencil;
    blowing variable-humidity controlled compressed dry air over the array of solder balls on the stencil to affect the viscosity of the flux free binder and to displace any stray excess solder balls remaining on the stencil; and
    vacuuming up and collecting any stray excess solder balls displaced by the blown compressed dry air thereover.

2. The process as recited in claim 1, including the step of:
    depositing the array of solder balls onto the wafer by dropping a number of solder balls from the ball mount head onto the stencil.

3. The process as recited in claim 1, including the step of:
    supporting the wafer on a three zone vacuum chuck to hold the wafer securely thereon.

4. The process as recited in claim 3, including the step of:
    arranging an array of vertically displaceable support pins within the three zone vacuum chuck so as to enable the lowering of the wafer onto the vacuum chuck in a controlled manner by a pneumatic pin control process.

5. The process as recited in claim 3, including the step of:
    controlling independently, each of the three zones of the vacuum chuck.

6. The process as recited in claim 5, including the step of:
    controlling the position of the chuck supported wafer in the x, y and z axes, and monitoring the position by a circuit included camera.

7. The process as recited in claim 1, including the step of:
    varying the speed, flow rate and temperature of the curtain of air blown onto the binder on the wafer supported on the chuck.

8. The process as recited in claim 1, including the step of:
    varying the temperature of the compressed dry air blown over the array of binder laden solder balls on the stencil to affect the viscosity of the binder.

9. The process as recited in claim 1, including the step of:
    blowing the curtain of compressed dry air blown in a dry air sweep process over the array of binder laden solder balls on the stencil at an angle to drive off excess binder from the wafer.

10. The process as recited in claim 9, including the step of:
    controlling the thickness of the binder by controlling the flow rate of the curtain of compressed dry air blown over the wafer.

11. The process as recited in claim 1, including the step of:
    driving the excess driven off binder from the wafer and into a lower drain port.

12. The process as recited in claim 1, including the step of:
    blowing the compressed dry air blown over the array of binder laden solder balls on the stencil at an angle to drive off excess solder balls from the wafer.

13. The process as recited in claim 9, including the step of:
    driving the excess solder balls driven off from the wafer towards a vacuum and collection vessel at a downstream end of the compressed dry air sweep process.

14. The process as recited in claim 13, including the step of:
    saving the excess solder balls driven off from the wafer towards and collected in the collection vessel at a downstream end of the compressed dry air sweep process for re-use in further wafer processing.

\* \* \* \* \*